United States Patent
Oman et al.

(10) Patent No.: US 7,064,963 B2
(45) Date of Patent: Jun. 20, 2006

(54) MULTI-SUBSTRATE CIRCUIT ASSEMBLY

(75) Inventors: Todd P. Oman, Greentown, IN (US);
Thomas A. Degenkolb, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 140 days.

(21) Appl. No.: 10/708,935

(22) Filed: Apr. 1, 2004

(65) Prior Publication Data

US 2005/0218505 A1    Oct. 6, 2005

(51) Int. Cl.
*H05K 1/11* (2006.01)
*H05K 1/03* (2006.01)
*H05K 1/00* (2006.01)
*B32B 3/00* (2006.01)

(52) U.S. Cl. ............... 361/792; 174/255; 174/252; 428/209

(58) Field of Classification Search ............. 361/792; 174/255, 252; 428/209
See application file for complete search history.

(56) References Cited

U.S. PATENT DOCUMENTS

| | | | |
|---|---|---|---|
| 5,936,843 A * | 8/1999 | Ohshima et al. | 361/760 |
| 6,365,964 B1 * | 4/2002 | Koors et al. | 257/718 |
| 6,625,037 B1 * | 9/2003 | Nakatani et al. | 361/762 |
| 6,703,564 B1 * | 3/2004 | Mori | 174/255 |
| 6,784,554 B1 * | 8/2004 | Kajiwara et al. | 257/778 |
| 6,873,043 B1 | 3/2005 | Oman | |

* cited by examiner

*Primary Examiner*—Kamand Cuneo
*Assistant Examiner*—Ivan Carpio
(74) *Attorney, Agent, or Firm*—Stefan V. Chmielewski

(57) ABSTRACT

Thermally managing high-power IC devices through the use of a circuit assembly comprising a ceramic substrate and an organic substrate. The ceramic substrate has at least one circuit component on a first surface thereof and a periphery defining a lateral surface surrounding the first surface. The organic substrate also comprises a first surface and a periphery defining a lateral surface surrounding the first surface. A portion of the lateral surface of the organic substrate is adjacent a portion of the lateral surface of the ceramic substrate so as to define an interface therebetween. At least one conductor common to both the ceramic and organic substrates and bridging the interface therebetween serves to physically connect the ceramic and organic substrates together.

20 Claims, 2 Drawing Sheets

MULTI-SUBSTRATE CIRCUIT ASSEMBLY

BACKGROUND OF INVENTION

1. Field of the Invention

The present invention generally relates to substrate materials and processes suitable for use in electronic systems. More particularly, this invention relates to a multi-substrate circuit assembly capable of exhibiting enhanced electrical and thermal performance, particularly for purposes of improving thermal management of power circuit devices.

2. Description of the Related Art

A variety of approaches are known for dissipating heat generated by high-power integrated circuit (IC) devices. Power IC devices mounted to organic substrates such as a printed circuit board (PCB) can be in the form of a plated through-hole (PTH) package attached to a heat rail. A drawback of this approach is the use of PTH packages instead of the more desirable SMT (Surface Mount Technology) packages. This approach also requires the added assembly steps required to attach a heat rail, which are not easily automated and add significantly to product height. A thermal management method for SMT packages on organic substrates involves the use of thermal vias that conduct heat through the substrate to a heatsink. However, this approach has limited thermal capability since organic substrates are poor thermal conductors that can only be minimally enhanced with thermal vias. In contrast to PTH and SMT packages, whose package exteriors include thermal-insulating plastic that inhibits heat conduction directly through the package wall, enhanced thermal management of high-power IC flip chips mounted to PCB's has been achieved with heat-conductive pedestals in direct thermal contact with a surface of the device. Notable examples of this approach are disclosed in commonly-assigned U.S. Pat. Nos. 6,180,436 and 6,365,964 to Koors et al., which disclose pedestals that contact the non-active backside surface of a chip opposite the solder connections that attach the chip to the substrate. However, this and the preceding solutions preclude dual-sided heat sinking due to the organic layers of the substrate.

Ceramic materials such as beryllia (BeO), alumina ($AlO_3$) and others have higher coefficients of thermal conductivity than organic substrates, and are therefore more often the substrate materials of choice for high-power IC chips. Because organic substrates offer excellent cost and conductor density benefits compared to ceramics, applications in which power IC devices are mounted to a ceramic substrate often include a PCB wire-bonded to the ceramic substrate to handle high-density routing requirements. However, this solution requires the more expensive serial process of wire-bonding. Furthermore, wire-bonds have assembly yield losses, current density issues, and adversely impact the critical electrical performance parameters of resistance and inductance. Finally, this approach is also limited by the inability to use dual-sided heat sinking because of the wire-bonds present on the surface of the power IC chip.

In view of the above, improvements in thermal management of power IC's would be desirable.

SUMMARY OF INVENTION

The present invention provides an approach for thermally managing high-power IC devices through the use of more then one type of substrate in order to take advantage of the better thermal capabilities of ceramic substrate materials and the better conductor densities and cost advantages of organic substrate materials. The approach also makes possible the use of dual-sided heat sinking and integrated solderless connections.

According to the invention, a circuit assembly is provided comprising a ceramic substrate and an organic substrate. The ceramic substrate has at least one circuit component on a first surface thereof and a periphery defining a lateral surface surrounding the first surface. The organic substrate also comprises a first surface and a periphery defining a lateral surface surrounding the first surface. A portion of the lateral surface of the organic substrate is adjacent a portion of the lateral surface of the ceramic substrate so as to define an interface therebetween. Finally, at least one conductor common to both the ceramic and organic substrates and bridging the interface therebetween serves to physically connect the ceramic and organic substrates together.

In view of the above, the present invention presents an alternative to typical methods of achieving desired conductor routing densities for high pin count devices and heat dissipation for power devices. To realize the benefits of organic and ceramic substrates in the same electronic assembly, the two substrates are combined with an integral connection scheme that makes use of the one or more common conductors of various possible configurations. For example, the common conductors may be conductors of the ceramic substrate that have been laminated into the organic substrate and overlap conductors of the organic substrate. Alternatively, the organic substrate can be processed to have a PTH (plated through-hole), and a common conductor can form solderless interconnect with the PTH. Forming the common conductor and the PTH or conductor on the organic substrate of the same material, e.g., copper, and with a coefficient of thermal expansion (CTE) matched to the substrate makes possible a high-performance, high-reliability inter-substrate interconnect.

Another advantage of the invention is the ability to employ dual-sided heat sinking of the circuit component on the ceramic substrate to facilitate increased power densities. At the same time, the organic substrate can be employed to handle high-density routing requirements and route control signals to circuit component on the ceramic substrate. High current source and drain conductors required by power IC field effect transistors (FET's) can be routed exclusively with conductors on the ceramic substrate. The conductors of the ceramic substrate can be extended to the opposite side of the organic substrate to provide terminals that can provide a solderless power connector interface.

Other objects and advantages of this invention will be better appreciated from the following detailed description.

DETAILED DESCRIPTION

Figure 1:
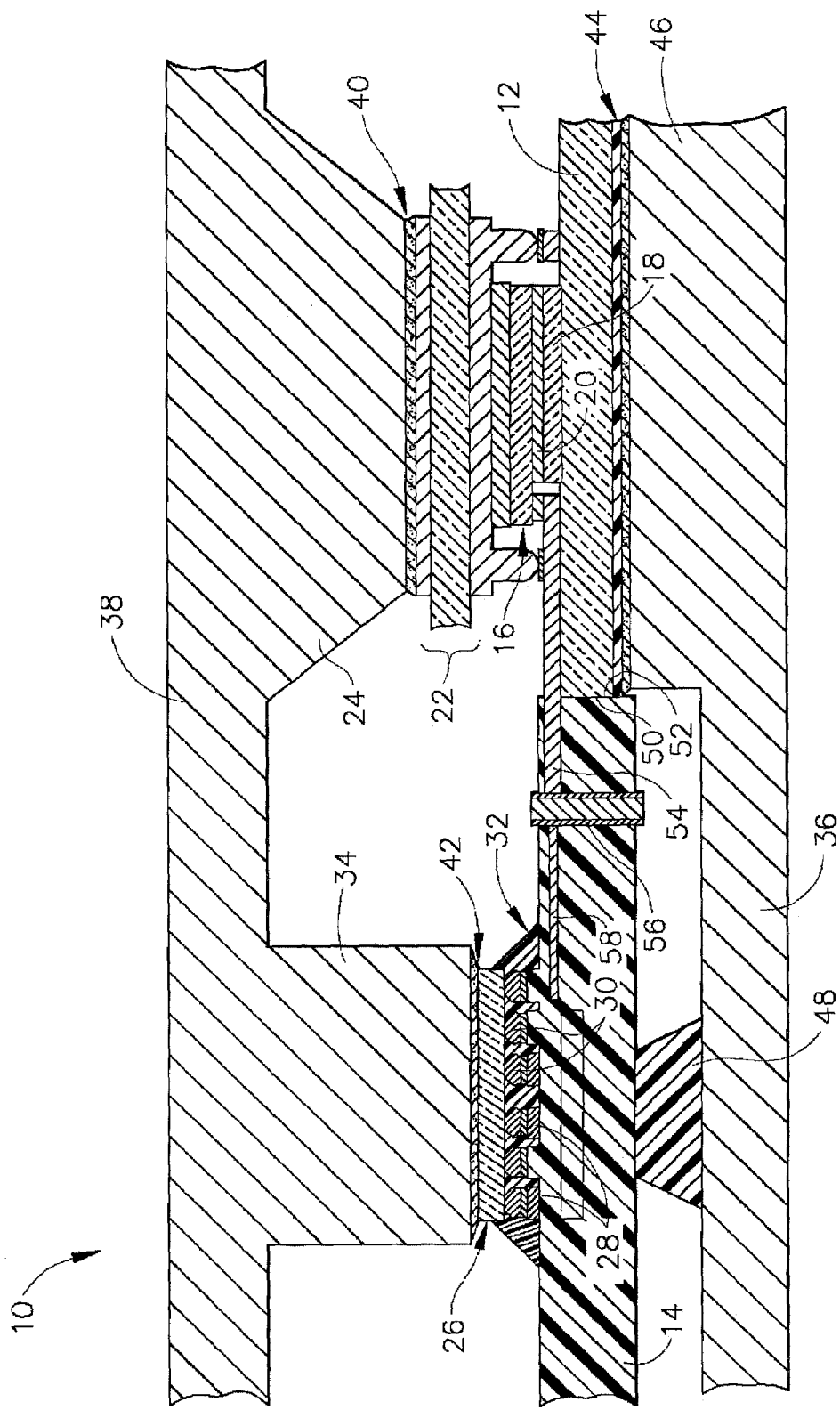
FIG. 1 represents a cross-sectional view of a casing containing a multiple-substrate assembly in accordance with an embodiment of the present invention.

FIG. 1 depicts a circuit assembly 10 containing multiple substrates 12 and 14 of different materials in accordance with the present invention. More particularly, the substrates 12 and 14 include a ceramic substrate 12 electrically and physically coupled to an organic substrate 14 positioned immediately adjacent and preferably coplanar and abutting the ceramic substrate 12, as depicted in FIG. 1. As a ceramic, the substrate 12 is preferably a monolithic structure of beryllia, alumina or another ceramic such as silicon nitride, etc., having a higher coefficient of thermal conductivity than the organic substrate 14. The organic substrate 14 is generally a printed circuit board (PCB) and can be formed of such conventional materials as a glass-reinforced or woven fiberglass-reinforced epoxy resin laminate available under the name FR-4 from various sources. Processing associated with organic laminate construction enables the organic substrate 14 to have higher conductor routing densities than possible with the ceramic substrate 12.

A power chip 16 is shown in FIG. 1 as being mounted to a surface of the ceramic substrate 12. The chip 16 is depicted as a semiconductor die having a frontside (lower surface in FIG. 1) and an oppositely-disposed topside (upper surface in FIG. 1). The power chip 16 is mounted to the ceramic substrate 12 by reflow-soldering one or more bond pads or other suitable terminals (not shown) on the frontside of the power chip 16 to one or more conductors 18 on the surface of the ceramic substrate 12 to yield solder connections 20. The power chip 16 may also have circuit elements, e.g., integrated circuitry, conductive traces, bond pads, etc. (not shown) on its topside which also require electrical connections. For this purpose, the chip 16 is shown in FIG. 1 as being coupled to a heat-conductive structure 22 disclosed in commonly-assigned U.S. patent application Ser. No. 10/385,106, now U.S. Pat. No. 6,873,043 to Oman. The heat-conductive structure 22 enables and promotes the conduction of heat to the ceramic substrate 12, as well as to a heat sink pedestal 24 described in fuller detail below.

As shown in FIG. 1, the assembly 10 includes a two-piece casing 36 and 38 (of which only portions are shown) that enclose the substrates 12 and 14 and their chips 16 and 26. The upper portion 38 of the case 36–38 is shown as comprising the heat sink pedestals 24 and 34. To facilitate manufacturing, the upper portion 38 and its pedestals 24 and 34 can be integrally formed as shown, such as by molding, stamping or forming a suitable thermally-conductive material, such as aluminum or another material having relatively high thermal conductivity and thermal mass. Alternatively, the pedestals 24 and 34 and casing portion 38 could be formed separately and of different materials and then secured together, such as with an adhesive, in which case the casing portions 36 and 38 can be formed of copper or another suitable packaging material known in the art. Films 40 and 42 of thermal grease, epoxy, etc., are preferably between the pedestals 24 and 34 and their respective chips 16 and 26. As evident from FIG. 1, a film 44 of thermal grease, epoxy, etc., is also preferably between the ceramic substrate 12 and the lower casing portion 36, which has an integral pedestal 46 that supports the ceramic substrate 12 from beneath. An elastomeric pedestal 48 is shown as supporting the organic substrate 14 from beneath and opposite the chip 26.

The substrates 12 and 14 are shown in a preferred embodiment in which they are substantially coplanar and portions of the lateral surfaces 50 and 52 of the substrates 12 and 14 abut and define an interface therebetween. According to a preferred aspect of the invention, communication between the substrates 12 and 14 and their chips 16 and 26 is desired. As a ceramic material, the substrate 12 has a higher coefficient of thermal conduction than the organic substrate 14, permitting the power chip 16 to generate relatively high power levels, such as in excess of five watts. On the other hand, the organic substrate 14 is capable of higher routing densities, such as for the purpose of routing control signals to the power chip 16 on the ceramic substrate 12. In FIG. 1, communication between the substrates 12 and 14 and their chips 16 and 26 is through at least one and preferably multiple common conductors 54 (of which one is visible in FIG. 1), which not only electrically but also physically couple the substrates 12 and 14. The conductors 54 may be conductors formed on the surface of the ceramic substrate 12 in accordance with conventional practice, except that they extend beyond the edge 50 of the ceramic substrate 12 and are laminated between two of the multiple dielectric layers of the organic substrate 14. In FIG. 1, the common conductor 54 is preferably formed (e.g., plated, bonded, or printed and fired) simultaneously with the conductors 18 of the chip 16.

Figure 2:
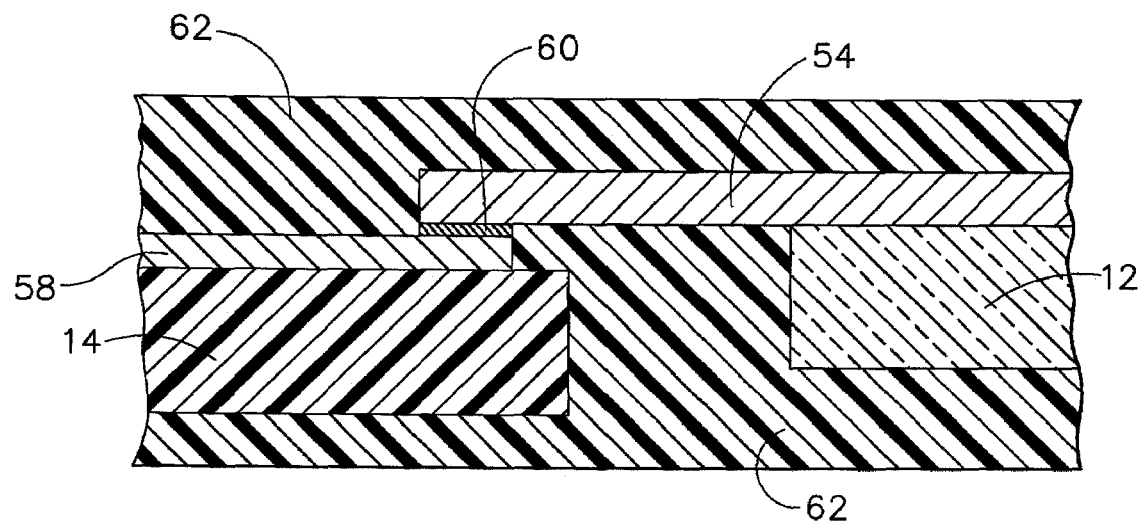
FIGS. 2 and 3 represent additional embodiments for electrically interconnecting the multiple-substrate assemblies of FIGS. 1 and 2.
Figure 3:
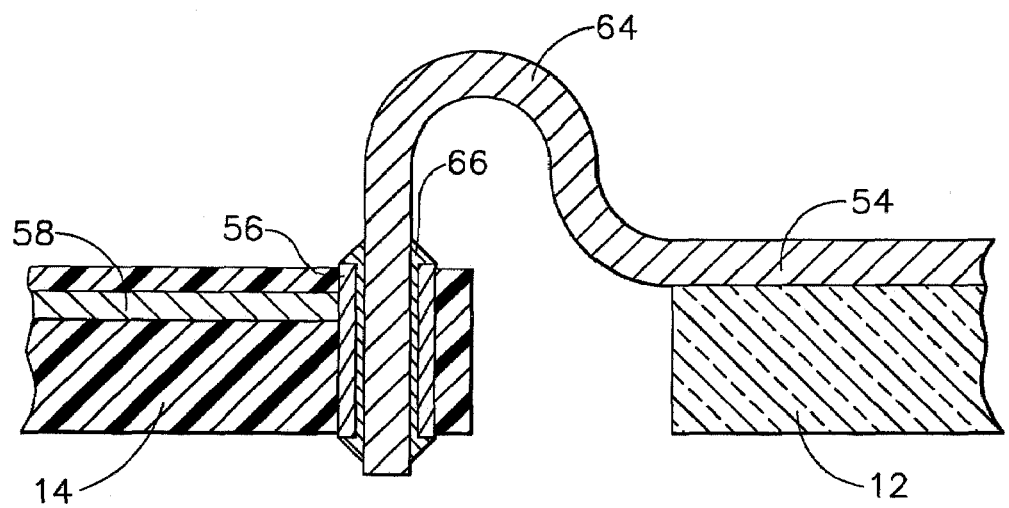

Electrical interconnection between the common conductors 54 and electrical circuitry on the organic substrate 14 can be made through various techniques. In FIG. 1, the organic substrate 14 has been processed to have a PTH (plated through-hole) 56. The common conductor 54 is shown as making a solderless interconnect with the PTH 56, through which the power chip 16 is electrically coupled to a conductor 58 of the organic substrate 14. Alternatively, FIG. 2 shows a common conductor 54 overlapping and attached with solder 60 to the conductor 58 of the organic substrate 14. An overmold layer 62 is shown in FIG. 2 as overlaying the substrates 12 and 14 to protect the interconnection. FIG. 3 shows another alternative embodiment, in which a common conductor 54 defines a compliant lead 64 that has been inserted and attached with solder 66 to the PTH 56 of FIG. 1. As represented in FIG. 3, the substrates 12 and 14 need not be mated at their facing lateral surfaces 50 and 52 because of the compliant nature of the lead 64. The compliant lead 64 can also eliminate any need for overmolding the substrates 12 and 14.

Forming the common conductor 54 and the PTH 56 and/or conductor 58 of the same material, e.g., copper, and with a coefficient of thermal expansion (CTE) matched to the organic substrate 14 promotes each of the interconnect alternatives of FIGS. 1, 2 and 3 to yield a high-performance, high-reliability interconnect. Depending on the type of interconnect, protection of the ceramic substrate 12 may also be desirable or necessary during processing. For example, the ceramic substrate 12 may be protected by a vinyl film during lamination of the organic substrate 14 or protected by a conventional photoresist material during plating of the PTH 56 and conductor 58.

From the above, it can be seen that the present invention offers a number of advantages. Two particularly desirable features of the invention are the ability to optimize substrate materials for required thermal performance and required electrical performance and routing density. As evident from FIG. 1, the invention also makes possible the use of dual-sided heat sinks (24, 34, 46 and 48). The invention is also able to reduce stresses on the solder joints of the power chip 16 from thermal expansion as a result of the ceramic substrate 12 having a coefficient of thermal expansion (about 8 ppm/° C. for $Si_3N_4$) nearer that of the chips 16 and 26 (about 4 ppm/° C. for silicon) than organic substrates such as FR4 (about 17 ppm/° C. in the circuit (x-y) plane). The capability of making solderless inter-substrate solder connections improves the quality and reliability of the circuit assembly. Finally, the advantages of this invention can be obtained using standard assembly processes.

While the invention has been described in terms of a preferred embodiment, it is apparent that other forms could be adopted by one skilled in the art. Accordingly, the scope of the invention is to be limited only by the following claims.

The invention claimed is:

1. A circuit assembly comprising:
   a ceramic substrate having at least one circuit component on a first surface thereof, the ceramic substrate having a periphery defining a lateral surface surrounding the first surface;
   an organic substrate comprising a first surface and a periphery defining a lateral surface surrounding the first surface, a portion of the lateral surface of the organic substrate being adjacent a portion of the lateral surface of the ceramic substrate so as to define an interface therebetween, the thickness of the ceramic substrate in a direction perpendicular to the first surface thereof being shorter than a length of the first surface thereof in a direction perpendicular to the interface; and
   at least one conductor common to both the ceramic and organic substrates so as to physically connect the organic and substrates together, the conductor bridging the interface between the ceramic and organic substrates.

2. A circuit assembly according to claim 1, wherein the organic substrate comprises multiple dielectric layers and the conductor is buried within the dielectric layers of the organic substrate.

3. A circuit assembly according to claim 1, wherein the conductor is on the first surface of the ceramic substrate and is electrically connected to the circuit component on the ceramic substrate.

4. A circuit assembly according to claim 1, wherein the ceramic substrate has a coefficient of thermal conductivity that is greater than the coefficient of thermal conductivity of the organic substrate.

5. A circuit assembly according to claim 1, wherein each of the ceramic and organic substrates comprises conductor patterns and the conductor patterns of the organic substrate are denser than the conductor patterns of the ceramic substrate.

6. A circuit assembly according to claim 1, further comprising a heatsink in thermal contact with a surface of the circuit component oppositely-disposed from the ceramic substrate.

7. A circuit assembly according to claim 1, further comprising a circuit component on the first surface of the organic substrate and a heatsink in thermal contact with a surface of the circuit component oppositely-disposed from the organic substrate.

8. A circuit assembly according to claim 1, wherein the ceramic and organic substrates are housed within a casing, the casing comprising first and second casing members, the first casing member supporting the ceramic substrate, the second casing member having a first heatsink pedestal in thermal contact with a surface of the circuit component oppositely-disposed from the ceramic substrate.

9. A circuit assembly according to claim 8, further comprising a circuit component on the first surface of the organic substrate, the second casing member having a second heatsink pedestal in thermal contact with a surface of the circuit component oppositely-disposed from the organic substrate.

10. A circuit assembly according to claim 9, the first casing member having a pedestal in thermal contact with a surface of the organic substrate oppositely-disposed from the circuit component on the organic substrate.

11. A circuit assembly according to claim 1, wherein the organic substrate comprises a second conductor and the conductor common to both the ceramic and organic substrates overlays and is soldered to the second conductor.

12. A circuit assembly according to claim 1, wherein the organic substrate comprises a plated through-hole and the conductor common to both the ceramic and organic substrates is solderlessly connected to the plated through-hole.

13. A circuit assembly according to claim 1, wherein the organic substrate comprises a plated through-hole and the conductor common to both the ceramic and organic substrates is compliant and is received within and soldered to the plated through-hole.

14. A circuit assembly according to claim 1, wherein the ceramic and organic substrates are substantially coplanar and the portion of the lateral surface of the ceramic substrate abuts and contacts the portion of the lateral surface of the organic substrate.

15. A circuit assembly comprising:
   a casing comprising first and second casing members;
   a ceramic substrate having a first surface and a periphery defining a lateral surface surrounding the first surface, the ceramic substrate having a second surface oppositely-disposed from the first surface and in thermal contact with the first casing member of the casing;
   a power integrated circuit chip on the first surface of the ceramic substrate, the power integrated circuit chip dissipating more than five watts;
   an organic substrate comprising at least one circuit component on a first surface thereof and a periphery defining a lateral surface surrounding the first surface, a portion of the lateral surface of the organic substrate abutting and contacting a portion of the lateral surface of the ceramic substrate so as to define an interface therebetween, the thickness of the ceramic substrate in a direction perpendicular to the first surface thereof being shorter than a length of the first surface thereof in a direction perpendicular to the interface, the organic substrate having a coefficient of thermal conductivity that is lower than the coefficient of thermal conductivity of the ceramic substrate; and
   at least one conductor common to both the ceramic and organic substrates so as to physically connect the organic and substrates together, the conductor bridging the interface between the ceramic and organic substrates;
   a first heatsink pedestal defined by the second casing member and in thermal contact with a surface of the power integrated circuit chip on the ceramic substrate; and
   a second heatsink pedestal defined by the second casing member and in thermal contact with a surface of the circuit component on the organic substrate.

16. A circuit assembly according to claim 15, wherein the organic substrate comprises multiple dielectric layers and the conductor is buried within the dielectric layers of the organic substrate.

17. A circuit assembly according to claim 15, wherein each of the ceramic and organic substrates comprises conductor patterns and the conductor patterns of the organic substrate are denser than the conductor patterns of the ceramic substrate.

18. A circuit assembly according to claim 15, wherein the organic substrate comprises a second conductor and the conductor common to both the ceramic and organic substrates overlays and is soldered to the second conductor.

19. A circuit assembly according to claim 15, wherein the organic substrate comprises a plated through-hole and the conductor common to both the ceramic and organic substrates is solderlessly connected to the plated through-hole.

20. A circuit assembly according to claim 15, wherein the organic substrate comprises a plated through-hole and the conductor common to both the ceramic and organic substrates is compliant and is received within and soldered to the plated through-hole.

* * * * *